US009638732B2

(12) United States Patent
Weinl

(10) Patent No.: US 9,638,732 B2
(45) Date of Patent: May 2, 2017

(54) METHOD AND CIRCUIT FOR ASSESSING PULSE-WIDTH-MODULATED SIGNALS

(71) Applicant: ZF Friedrichshafen AG, Friedrichshafen (DE)

(72) Inventor: Florian Weinl, Bodolz (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 14/892,600

(22) PCT Filed: Apr. 23, 2014

(86) PCT No.: PCT/EP2014/058178
§ 371 (c)(1),
(2) Date: Nov. 20, 2015

(87) PCT Pub. No.: WO2014/187630
PCT Pub. Date: Nov. 27, 2014

(65) Prior Publication Data
US 2016/0084897 A1    Mar. 24, 2016

(30) Foreign Application Priority Data

May 21, 2013    (DE) ........................ 10 2013 209 309

(51) Int. Cl.
*G01R 29/027* (2006.01)
*G01R 29/02* (2006.01)
*G01R 29/08* (2006.01)

(52) U.S. Cl.
CPC ....... *G01R 29/0273* (2013.01); *G01R 29/023* (2013.01); *G01R 29/0276* (2013.01); *G01R 29/0892* (2013.01)

(58) Field of Classification Search
CPC G01R 29/023; G01R 29/027; G01R 29/0273; G01R 29/0276; G01R 29/0892; G08C 19/28
(Continued)

(56) References Cited

U.S. PATENT DOCUMENTS 3,371,280 A    2/1968  Gill, Jr.
3,961,271 A    6/1976  Zlydak et al.
(Continued)

FOREIGN PATENT DOCUMENTS

DE    31 03 282 A1    9/1982
DE    31 20 622 A1    12/1982
(Continued)

OTHER PUBLICATIONS

"Fujitsu: 8-Bit-MCU's mit integrierten Analog-Komparatoren und Op-Amp" Hanser Automotive, Sep. 1, 2011, 2 pages.
(Continued)

*Primary Examiner* — Hoai-An D Nguyen
(74) *Attorney, Agent, or Firm* — Davis & Bujold, PLLC; Michael J. Bujold

(57) ABSTRACT

A method of assessing a pulse-width-modulated signal in which the pulse-width-modulated signal to be assessed is applied to a first input of a microcontroller and a signal, that depends on the pulse-width-modulated signal being assessed, is applied to a second input of the microcontroller for assessment. The pulse-width-modulated signal being assessed is applied to a voltage divider to produce the signal that depends on the same. For the pulse-width-modulated signal to be assessed and for the signal that depends on the same, in each case, the microcontroller determines a time interval between signal edges of the respective signal, and the signal is assessed on the basis of a difference between the time interval between the signal edges in the pulse-width-
(Continued)

modulated signal to be assessed and the time interval between the signal edges in the signal that depends on the same.

9 Claims, 2 Drawing Sheets

(58) Field of Classification Search
USPC .......... 324/76.11, 76.77, 133, 600, 649, 658, 324/676, 691, 710; 340/1.1, 12.1, 12.15, 340/12.16; 702/1, 57, 79
See application file for complete search history.

(56) References Cited

U.S. PATENT DOCUMENTS

| | | | | |
|---|---|---|---|---|
| 4,339,723 | A * | 7/1982 | Yee | H04Q 9/14 327/31 |
| 4,413,260 | A * | 11/1983 | Siegel | G07F 17/305 194/216 |
| 4,745,365 | A | 5/1988 | Ugenti | |
| 4,904,947 | A | 2/1990 | Olivenbaum et al. | |
| 5,640,315 | A * | 6/1997 | Hirano | H02M 3/33507 363/41 |
| 6,292,507 | B1 * | 9/2001 | Hardin | H03L 7/0898 327/148 |
| 7,812,590 | B2 * | 10/2010 | Kaltenegger | G01R 31/024 324/429 |
| 2002/0153885 | A1 * | 10/2002 | Blossfeld | G08C 19/22 324/252 |
| 2005/0179576 | A1 | 8/2005 | Tarui et al. | |
| 2010/0026531 | A1 | 2/2010 | Liu et al. | |
| 2012/0155524 | A1 * | 6/2012 | Yoshida | H04L 25/03834 375/224 |
| 2016/0368532 | A1 * | 12/2016 | Weber | B62D 5/0472 |

FOREIGN PATENT DOCUMENTS

| | | |
|---|---|---|
| DE | 10 2007 030 589 A1 | 1/2009 |
| EP | 0 343 579 A2 | 11/1989 |
| GB | 2 156 612 A | 10/1985 |

OTHER PUBLICATIONS

Brett Novak, "Utilizing Microcontroller Integrated Analog Comparators to Provide Power Protection and Reduce Board Space", Texas Instruments, Jul. 2012, pp. 1-6.
German Search Report Corresponding to 10 2013 209 309.8 mailed Oct. 16, 2013.
International Search Report Corresponding to PCT/EP2014/058178 mailed Jul. 28, 2014.
Written Opinion Corresponding to PCT/EP2014/058178 mailed Jul. 28, 2014.

* cited by examiner

METHOD AND CIRCUIT FOR ASSESSING PULSE-WIDTH-MODULATED SIGNALS

This application is a National Stage completion of PCT/EP2014/058178 filed Apr. 23, 2014, which claims priority from German patent application serial no. 10 2013 209 309.8 filed May 21, 2013.

FIELD OF THE INVENTION

The invention concerns a method for assessing pulse-width-modulated signals and a circuit for assessing pulse-width-modulated signals.

BACKGROUND OF THE INVENTION

In numerous applications signals emitted from a signal source have to be transmitted to a microcontroller for evaluation and further processing. In that context it is already part of the prior art to transmit signals as pulse-width-modulated signals. For this it is important to monitor and assess the signal quality of a pulse-width-modulated signal. In practice sensors are known, which in addition to the actual pulse-width-modulated signal to be assessed, produce an inverted pulse-width-modulated signal such that the pulse-width-modulated signal and the inverted pulse-width-modulated signal are transmitted to a microcontroller byway of separate signal lines. By evaluating the pulse-width-modulated signal and the inverted pulse-width-modulated signal the microcontroller can then assess the signal quality of the pulse-width-modulated signal. However, the provision of an additional signal line for transmitting the inverted pulse-width-modulated signal entails greater technical equipment complexity and is therefore disadvantageous.

From DE 10 2007 030 589 A1 a method and a circuit for assessing a pulse-width-modulated signal are known, in which a signal source provides on the one hand a pulse-width-modulated signal via a first channel and on the other hand an inverted pulse-width-modulated signal via a second channel, and wherein, with the help of a differentiator and an elaborate evaluation circuit the signal quality of the pulse-width-modulated signal is assessed on the basis of the pulse-width-modulated signal and the inverted pulse-width-modulated signal.

Although it is already basically possible to assess the signal quality of a pulse-width-modulated signal in a microprocessor on the basis of the pulse-width-modulated signal and an inverted pulse-width-modulated signal provided via a separate signal line, there is a need to simplify the assessment of the signal quality of a pulse-width-modulated signal, in particular in order to reduce the technical equipment complexity.

SUMMARY OF THE INVENTION

Starting from there, the purpose of the present invention is to provide a new type of method for assessing pulse-width-modulated signals, and a circuit for assessing pulse-width-modulated signals.

This objective is achieved by a method according to the invention, in which the pulse-width-modulated signal to be assessed is applied to a voltage divider in order to produce from the pulse-width-modulated signal to be assessed a signal that depends on the same, such that the microcontroller determines on the one hand for the pulse-width-modulated signal to be assessed and on the other hand for the signal that depends on the same, in each case a time interval between signal edges of the respective signals, and such that the signal assessment is effected on the basis of a difference between the time interval between the signal edges of the pulse-width-modulated signal to be assessed and the time interval between the signal edges of the signal that depends on the same.

In the context of the invention, to assess a primary pulse-width-modulated signal emitted from a signal source, exclusively a voltage divider is required, which from the pulse-width-modulated signal to be assessed generates a secondary signal that depends on the primary signal, such that the primary signal to be assessed and the secondary signal which is produced by the voltage divider and which depends on the primary signal are applied to two different inputs of the microcontroller. The microcontroller then determines the time interval between the signal edges of the signals and on the basis of a difference between the time interval between the signal edges in the pulse-width-modulated primary signal to be assessed and the time interval between the signal edges in the secondary signal that depends on the primary signal, assesses the signal quality of the primary signal. Thus, it is not necessary for the signal source to send an inverted pulse-width-modulated signal to the microcontroller via a signal line of its own. Rather, by means of a simple voltage divider from which the pulse-width-modulated signal to be assessed, or primary signal, generates a signal, or secondary signal, that depends on the primary signal, the primary signal and secondary signal being sent to separate inputs of the microcontroller, so that the microcontroller can then evaluate the signal edges in the secondary signal and in the primary signal in order to assess the signal quality of the pulse-width-modulated primary signal.

Preferably, when the difference between the time interval between the signal edges of the pulse-width-modulated, or primary signal and between the signal edges of the signal that depends on the same, or secondary signal, is relatively small, the quality of the pulse-width-modulated signal to be assessed can be concluded to be good, whereas if the difference between the time interval between the signal edges of the pulse-width-modulated, or primary signal and between the signal edges of the signal that depends on the same, or secondary signal, is relatively large, the quality of the pulse-width-modulated signal to be assessed can be concluded to be poor. This assessment of the signal quality of the pulse-width-modulated signal is simple and reliable.

According to an advantageous further development of the invention, in each case the time interval between a failing signal edge and a rising signal edge is determined, a falling signal edge being identified when a relatively high signal level falls below a first limit value whereas a rising signal edge is identified when a relatively low signal level rises above a second limit value which is higher than the first limit value. The above determination of the respective time intervals between falling and rising signal edges is simple and reliable, and enables a simple and reliable assessment of the signal quality of a pulse-width-modulated signal and thus of the primary signal emitted by the signal source.

The circuit according to the invention for the assessment of pulse-width-modulated signals is described below. According to the invention a voltage divider is connected to the microcontroller, which from the pulse-width-modulated signal to be assessed produces the signal that depends on the same, in such manner that on the one hand in the pulse-width-modulated signal to be assessed and on the other hand in the signal that depends on it the microcontroller determines in each case a time interval between signal edges of the signals, and wherein the microcontroller assesses the signal on the basis of a difference of the time interval between the signal edges in the pulse-width-modulated signal to be assessed and the time interval between the signal edges in the signal that depends on the same.

With little technical equipment complexity the circuit enables a simple and reliable assessment of the signal quality of the pulse-width-modulated signal.

According to an advantageous further development, the voltage divider comprises electrical resistors connected in series, which are connected to the microcontroller and the signal source in such manner that a first electrical resistor of the series circuit is connected between the first input of the microcontroller and the second input of the microcontroller whereas a second electrical resistor of the series circuit is connected between the second input of the microcontroller and a ground terminal of the microcontroller, the ground terminals of the microcontroller and the signal source being short-circuited and a further electrical resistor being connected between a signal output of the signal source and the first input of the microcontroller. This design is particularly simple.

Preferably, a first capacitor is connected parallel to the electrical resistors of the voltage divider, whereas a second capacitor is connected between the ground terminal of the signal source and the signal output of the signal source, and whereas a voltage supply is connected on the one hand to a voltage supply terminal of the signal source and on the other hand, with interposition of a further electrical resistor, to the signal output of the signal source. This enables a particularly advantageous connection of the signal source to the microcontroller.

Preferably, the first input of the microcontroller and the second input of the microcontroller are in the form of analog-digital-converter inputs with a timer unit, such that the first and second inputs of the microcontroller have a high level and a low level that lie within an acceptable tolerance band. This enables a particularly accurate assessment of the signal quality of a pulse-width-modulated signal.

BRIEF DESCRIPTION OF THE DRAWINGS

Preferred further developments of the invention emerge from the description given below. Example embodiments of the invention, to which it is not limited, are explained in more detail with reference to the drawing, which shows.

DETAILED DESCRIPTION OF THE PREFERRED EMBODIMENTS

The present invention concerns a method for assessing a pulse-width-modulated signal and a circuit for carrying out the method.

Figure 1:
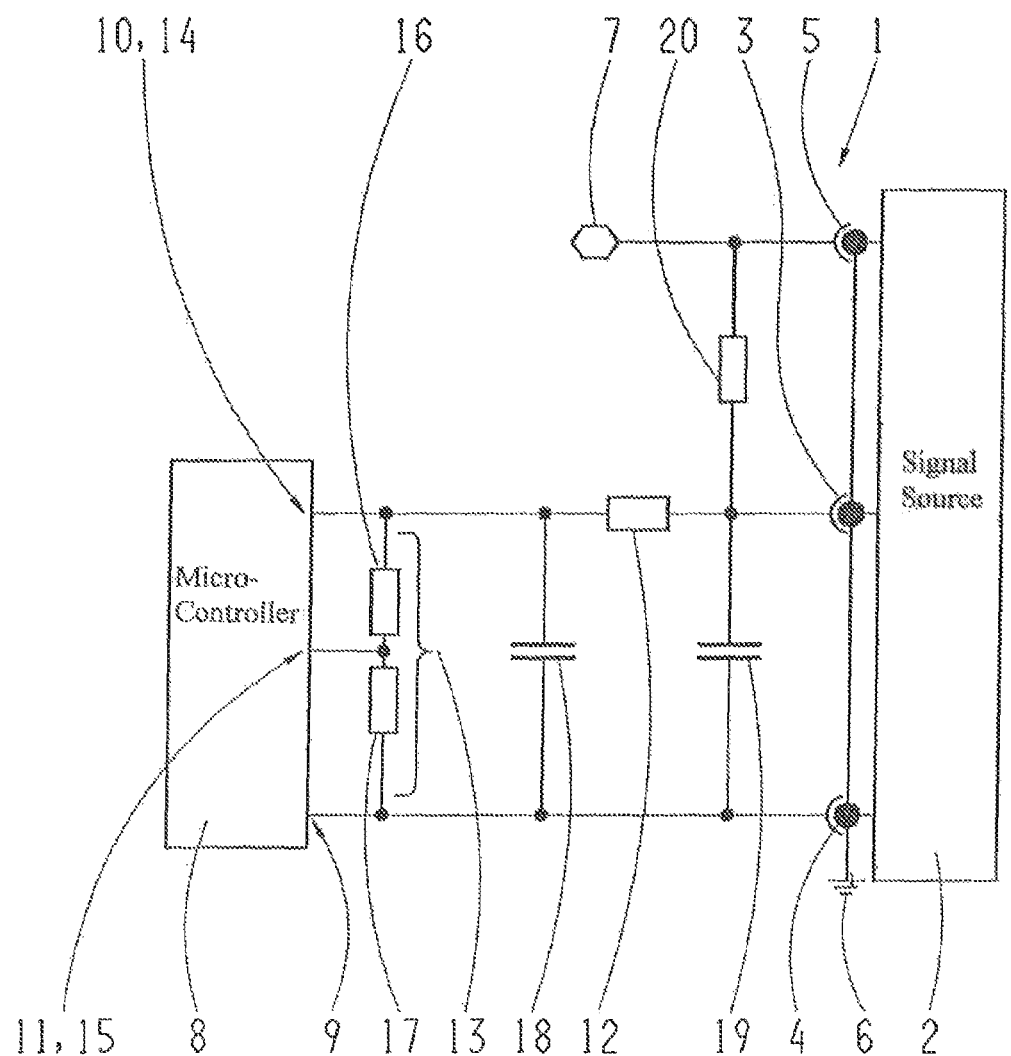
FIG. 1: A circuit according to the invention for assessing a pulse-width-modulated signal.

FIG. 1 shows a preferred embodiment of a circuit 1 for assessing a pulse-width-modulated signal, which serves for the implementation of the method according to the invention; details of the method according to the invention will be given below with reference to the circuit shown in FIG. 1.

The circuit 1 for assessing a pulse-width-modulated signal has a signal source 2, which provides at a signal output 3 a pulse-width-modulated signal or primary signal to be assessed. The signal source can be, for example, a sensor built into a vehicle transmission.

In addition to the signal output 3 the signal source 2, which emits the pulse-width-modulated signal to be assessed at the signal output 3, also comprises a ground terminal 4 and a voltage supply terminal 5, the ground terminal being connected to ground potential 6 and the voltage supply terminal 5 being connected to a voltage supply potential 7.

Furthermore, the circuit 1 comprises a microcontroller 8. In addition to a ground terminal 9 short-circuited to the ground terminal 4 of the signal source 2 and therefore also connected to ground potential 6, the microcontroller 8 has at least two inputs 10 and 11. The pulse-width-modulated, primary signal 14 to be assessed is applied by the signal source 2 to a first input 10 of the microcontroller 8, and it can be seen in FIG. 1 that an electrical resistor 12 is connected between the signal output 3 of the signal source 2 and the first input 10 of the microcontroller 8.

To a second input 11 of the microcontroller 8 is applied a secondary signal that depends on the pulse-width-modulated, primary signal to be assessed, this secondary signal that depends on the pulse-width-modulated, primary signal, which is applied to the second input 11, being emitted from a voltage divider 13. The voltage divider 13 is connected to the microcontroller 8 in such manner that to the first input 10 is applied the actual pulse-width-modulated, primary signal to be assessed, emitted by the signal source 2 at its signal output 3, whereas in contrast, to the second terminal 11 is applied a secondary signal derived from or dependent upon the primary signal.

Figure 2:
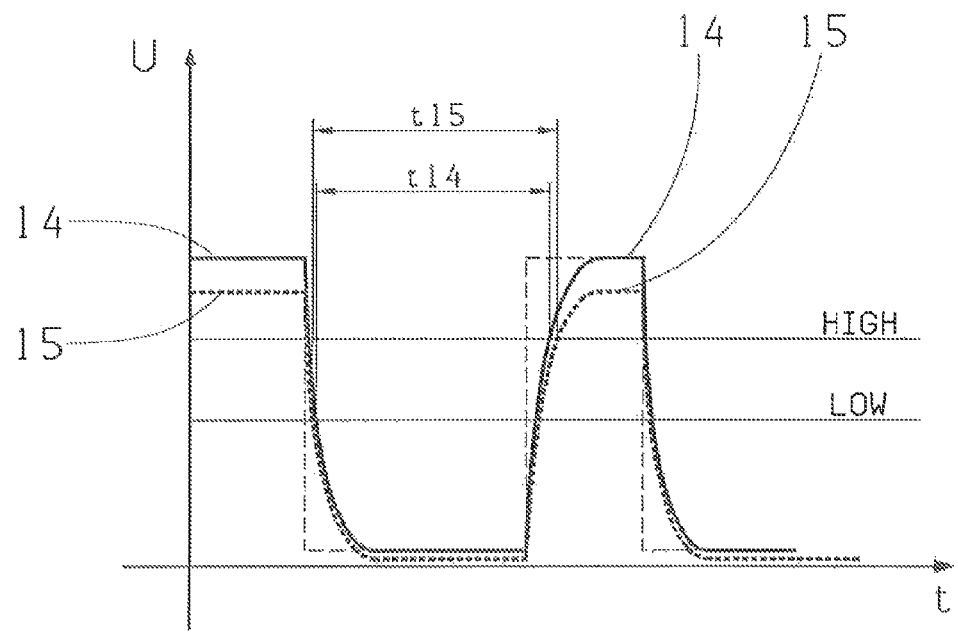
FIG. 2: A first diagram to make clear the mode of operation of the circuit according to the invention.
Figure 3:
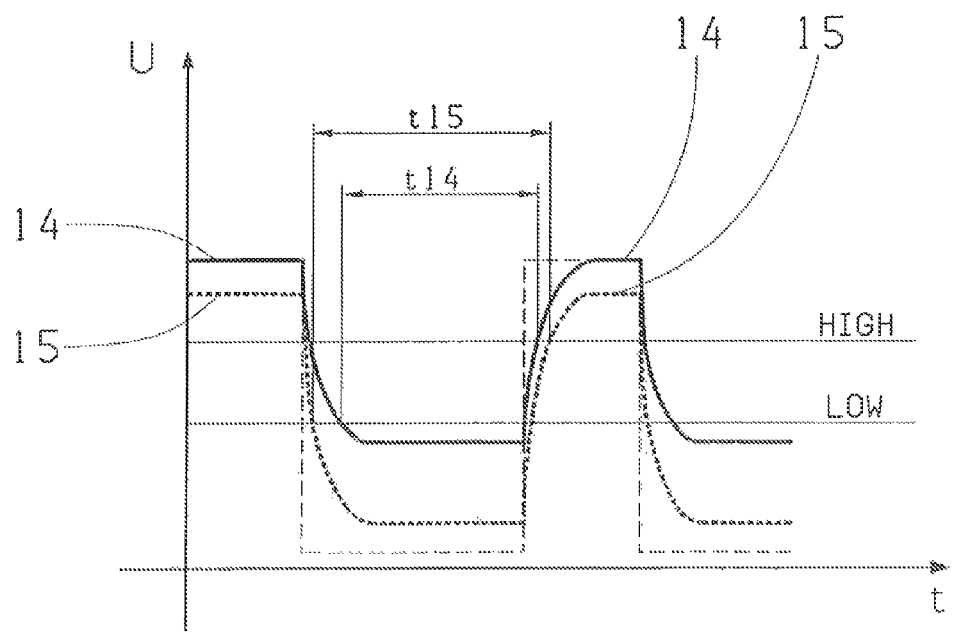
FIG. 3: A second diagram to make clear the mode of operation of the circuit according to the invention.

The microcontroller 8 determines, on the one hand in the pulse-width-modulated primary signal 14 that is applied at the first input 10 and is to be assessed, and on the other hand in the secondary signal 15 that depends on the primary signal and is applied at the input 11, in each case a time interval between signal edges of the respective signal, and the microcontroller 8 assesses the signal on the basis of a difference between the respective time intervals between the signal edges of the primary signal 14 and the secondary signal 15. Below, this signal assessment of the pulse-width-modulated signal is described with reference to FIGS. 2 and 3. FIGS. 2 and 3 show in each case variations plotted against time t of signal voltages U of the pulse-width-modulated or primary signal 14 to be assessed and of the secondary signal 15, which is produced by the voltage divider 13 and depends on the primary signal. The primary signal 14 is applied at the first input 10 of the microcontroller 8 and the secondary signal 15 is applied at the second input 11 of the microcontroller.

As already mentioned, the microcontroller 8 determines on the one hand in the primary signal 14 and on the other hand in the secondary signal 15 a time interval between the signal edges of the respective signal, namely in FIGS. 2 and 3 time intervals t14 and t15 between falling signal edges and rising signal edges of the signals 14 and 15. Thus, the time interval t14 corresponds to the time interval between a falling and a rising signal edge of the primary signal 14, whereas the time interval t15 corresponds to the time interval between a falling and a rising signal edge of the secondary signal 15.

The microcontroller determines a difference between these time intervals t14 and t15. When this difference between the time interval t14 between the signal edges of the primary signal 14 and the time interval t15 between the signal edges of the secondary signal 15 is relatively small, as it is in FIG. 2, it is concluded that the signal quality of the pulse-width-modulated signal 14 to be assessed is good, whereas in contrast, if the difference between the time interval t14 between the signal edges of the primary signal 14 and the time interval t15 between the signal edges of the secondary signal 15 is relatively large, as it is in FIG. 3, it is concluded that the signal quality of the pulse-width-modulated signal 14 to be assessed is poor.

The time interval t14 or t15 between a falling and a rising signal edge is determined at the terminals 10 and 11 of the microcontroller 8 in such manner that a falling signal edge is identified when, starting from a relatively high signal level, the signal 14 or 15 concerned falls below a first limit value "Low", whereas in contrast a rising signal edge is identified when, starting from a relatively low signal level, the signal 14 or 15 concerned rises above a second limit value "High", which is larger than the first limit value "Low".

The two inputs 10 and 11 of the microcontroller 8 are analog-digital converter inputs with timer units, such that the first input 10 and the second input 11 of the microcontroller have in each case a High-level and a Low-level which are nearly identical, and which therefore lie within an acceptable tolerance band.

The voltage divider 13 provided according to the invention consists of a series connection of electrical resistors 16 and 17. A first electrical resistor 16 of the voltage divider 13 is connected between the first input 10 and the second input 11 of the microcontroller 8. A second electrical resistor 17 of the voltage divider 13 is connected between the second input 11 and the ground terminal 9 of the microcontroller 8. As already mentioned, the ground terminals 4 and 9 of the signal source 2 and the microcontroller 8 are short-circuited and are both connected to ground potential 6.

The electrical resistor 12 is connected between the signal output 3 of the signal source 2 and the first input 10 of the microcontroller 8. As shown in FIG. 1, a first capacitor 18 is connected parallel to the voltage divider 13 and a second capacitor 19 is connected between the signal output 3 and the ground terminal 4 of the signal source 2. The voltage supply potential 7 is connected directly to the voltage supply terminal 5 of the signal source 2, and a further electrical resistor 20 is connected between the voltage supply source 7 and the signal output 3 of the signal source 2.

Thus, according to the invention a pulse-width-modulated primary signal to be assessed is emitted by a signal source 2 to a signal output 3 thereof, and this primary signal to be assessed is applied to a first input 10 of a microcontroller 8. Connected to the microcontroller 8 is a voltage divider 13, which produces a secondary signal that depends on the primary signal, this signal being applied to the second input 11 of the microcontroller 8. These two inputs 10 and 11 of the microcontroller 8 are in each case analog-digital converter inputs with a timer unit, which have almost identical high-levels and low-levels. In these signals, namely the primary signal and the secondary signal, the microcontroller 8 determines respective time intervals t14 and t15 between the falling and rising signal edges of the signal concerned, and from a difference between these time intervals the signal quality of the primary or pulse-width-modulated signal is assessed. The larger the difference between the time intervals, the poorer is the signal quality. the smaller the difference, the better is the signal quality.

If the difference between the time intervals is larger than a limit value, it can be concluded that the primary signal is faulty. On the other hand, if the difference is smaller than a limit value it can be concluded that the primary signal is not defective. The above signal assessment of the pulse-width-modulated signal can also be used for a trend analysis, particularly in the sense that a successive increase of the difference between the time intervals between the signal edges of the primary and secondary signal indicates that the signal source is aging. On the basis of the difference between the time intervals a signal correction of the primary signal can also be carried out.

INDEXES

1 Circuit
2 Signal source
3 Signal output
4 Ground terminal
5 Voltage supply terminal
6 Ground potential
7 Voltage supply potential
8 Microcontroller
9 Ground terminal
10 Input
11 Input
12 Resistor
13 Voltage divider
14 Primary signal
15 Secondary signal
16 Resistor
17 Resistor
18 Capacitor
19 Capacitor
20 Resistor

The invention claimed is:

1. A method of assessing a pulse-width-modulated signal, the method comprising:
   applying a pulse-width-modulated signal to be assessed to a first input of a microcontroller,
   applying a signal that depends on the pulse-width-modulated signal to be assessed to a second input of the microcontroller for assessment by the microcontroller,
   applying the pulse-width-modulated signal to be assessed to a voltage divider to produce, from the pulse-width-modulated signal, a signal that depends on the pulse-width-modulated signal to be assessed,
   determining, via the microcontroller, for the pulse-width-modulated signal to be assessed and for the signal that depends on the pulse-width-modulated signal to be assessed, a time interval between signal edges of the respective signals, and
   accessing the pulse-width-modulated signal to be assessed on a basis of a difference between the time interval between the signal edges in the pulse-width-modulated signal to be assessed and the time interval between the signal edges in the signal that depends on the pulse-width-modulated signal to be assessed.

2. The method according to claim 1, further comprising a step of:
   if the difference between the time interval between the signal edges in the pulse-width-modulated signal to be assessed and the time interval between the signal edges in the signal that depends on the pulse-width-modulated signal to be assessed is relatively small, concluding that a signal quality of the pulse-width-modulated signal to be assessed is good, and
   if the difference between the time interval between the signal edges in the pulse-width-modulated signal to be assessed and the time interval between the signal edges in the signal that depends on the pulse-width-modulated signal to be assessed is relatively large, concluding that the signal quality of the pulse-width-modulated signal to be assessed is poor.

3. The method according to claim 1, further comprising a step of in each case of the pulse-width-modulated signal to be assessed and the signal that depends on the pulse-width-modulated signal to be assessed, determining the time interval between a falling signal edge and a rising signal edge, and the falling signal edge is identified if a high signal level falls below a first limit value, and the rising signal edge is identified if a low signal level rises above a second limit value, and the second limit value being larger than the first limit value.

4. A circuit (1) for assessing a pulse-width-modulated signal, the circuit comprising:
 a signal source (2) which emits the pulse-width-modulated signal to be assessed;
 a microcontroller (8) which assesses the pulse-width-modulated signal to be assessed, the pulse-width-modulated signal to be assessed being applied to a first input (10) of the microcontroller (8) and a second signal that depends on the pulse-width-modulated signal to be assessed being applied to a second input (11) of the microcontroller (8);
 a voltage divider (13) being connected to the microcontroller (8), the voltage divider (13) generating, from the pulse-width-modulated signal to be assessed, a signal that depends on the pulse-width-modulated signal to be assessed;
 the microcontroller (8) determining for the pulse-width-modulated signal to be assessed and for the signal that depends on the pulse-width-modulated signal to be assessed, a time interval between signal edges of the signal concerned, and the microcontroller (8) assessing the signal based on a difference between the time interval between the signal edges in the pulse-width-modulated signal to be assessed and the time interval between the signal edges in the signal that depends on the pulse-width-modulated signal to be assessed.

5. The circuit according to claim 4, wherein the voltage divider (13) comprises first and second electrical resistors (16, 17) connected in series, which are connected to the microcontroller (8) and to the signal source (2) in such a manner that the first electrical resistor (16) connected in series is connected between the first input (10) of the microcontroller (8) and the second input (11) of the microcontroller (8), and the second electrical resistor (17) connected in series is connected between the second input (11) of the microcontroller (8) and a ground terminal (9) of the microcontroller (8), the ground terminal (9) of the microcontroller (8) and a ground terminal (4) of the signal source (2) are short-circuited, and a third electrical resistor (12) is connected between a signal output (3) of the signal source (2) and the first input (10) of the microcontroller (8).

6. The circuit according to claim 5, wherein a first capacitor (18) is connected parallel to the first and the second electrical resistors (16, 17) of the voltage divider (13), and a second capacitor (19) is connected between the ground terminal (4) of the signal source (2) and the signal output (3) of the signal source (2).

7. The circuit according to claim 5, wherein a voltage supply (7) is connected to a voltage supply terminal (5) of the signal source (2), and is connected, via a fourth electrical resistor (20), to the signal output (3) of the signal source (2).

8. The circuit according to claim 4, wherein the first input (10) and the second input (11) of the microcontroller (8) are, in each case, an analog-digital-converter input with a timer unit, and the first input (10) and the second input (11) of the microcontroller (8) have a high-level and a low-level that lie within an acceptable tolerance band.

9. A method for assessing a pulse-width-modulated signal, the method comprising steps of:
 transmitting a primary signal from a signal source to a first input of a microcontroller and to a voltage divider, the primary signal being defined as the pulse-width-modulated signal to be assessed;
 producing, via the voltage divider, a dependent signal which is dependent on the primary signal, and transmitting the dependent signal from the voltage divider to a second input of the microcontroller;
 measuring a primary duration of time that extends from a leading edge of the primary signal to a trailing edge of the primary signal;
 measuring a secondary duration of time that extends from a leading edge of the dependent signal to a trailing edge of the dependent signal;
 determining a difference between the primary duration of time and the secondary duration of time; and
 assessing a signal quality of the primary signal based on the difference between the primary duration of time and the secondary duration of time.

* * * * *